US007675034B2

(12) United States Patent
Faber

(10) Patent No.: US 7,675,034 B2
(45) Date of Patent: Mar. 9, 2010

(54) CHARGED PARTICLE INSTRUMENT EQUIPPED WITH OPTICAL MICROSCOPE

(75) Inventor: Jacob Simon Faber, Eindhoven (NL)

(73) Assignee: FEI Company, Hillsboro, OR (US)

(*) Notice: Subject to any disclaimer, the term of this patent is extended or adjusted under 35 U.S.C. 154(b) by 152 days.

(21) Appl. No.: 12/130,038

(22) Filed: May 30, 2008

(65) Prior Publication Data
US 2008/0296499 A1 Dec. 4, 2008

(30) Foreign Application Priority Data
May 31, 2007 (EP) .................................. 07109317
Jul. 25, 2007 (EP) .................................. 07113074

(51) Int. Cl.
*G01N 13/10* (2006.01)
*G01N 23/02* (2006.01)
*G21K 5/04* (2006.01)
(52) U.S. Cl. ................. 250/311; 250/310; 250/306; 250/396 R; 850/6
(58) Field of Classification Search ............. 250/311, 250/310, 306, 396 R; 850/6
See application file for complete search history.

(56) References Cited

U.S. PATENT DOCUMENTS

| | | | |
|---|---|---|---|
| 4,183,614 A | 1/1980 | Feldman | |
| 4,349,242 A | 9/1982 | Ogura | |
| 4,537,477 A | 8/1985 | Takagi et al. | |
| 6,552,341 B1 | 4/2003 | Desplats et al. | |
| 6,580,076 B1 | 6/2003 | Miyazaki | |
| 7,297,945 B2 * | 11/2007 | Hazaki et al. | 250/306 |
| 7,485,856 B2 * | 2/2009 | Kley | 250/306 |
| 7,553,334 B2 * | 6/2009 | Hazaki et al. | 850/8 |
| 2006/0284108 A1 | 12/2006 | Buijsse et al. | |

OTHER PUBLICATIONS

Walls, J.M. et al. Super smooth metal oxide thin films using closed field reactive magnetron sputtering, 48th Annual Technical Conference Proceedings of the Society of Vacuum Coaters (2005), 36-40.
Gobbi, Poetro et al., "Correlative High-Resolution Morphologic Analysis of the Three-Dimensional Organization of Human Chromosomes," Scanning, Feb. 2000, pp. 273-281, vol. 22.
SPI Supplies, "SPI Supplies Brand Indium-Tin-Oxide (ITO) Coated Microscope Slides," Website, http://www.2spi.com/catalog/standards/ITO-coated-slides-resistivities2.html, Publication date unknown, Retrieved Oct. 14, 2009, 2 Pages.

* cited by examiner

*Primary Examiner*—Nikita Wells
(74) *Attorney, Agent, or Firm*—Scheinberg & Griner, LLP; Michael O. Scheinberg; David Griner

(57) ABSTRACT

An optical microscope slide in a charged particle instrument such as an electron microscope or a focused ion beam instrument. Conventional microscope slides are not fit for use in an electron microscope as they are insulating and would thus charge when viewed in an electron microscope due to the impinging beam of charged particles. However, microscope slides exist that show a coating with a conductive layer of e.g. Indium Tin Oxide (ITO). These microscope slides are normally used for heating the object mounted on the slide by passing a current through the conductive layer. Experiments show that these microscope slides can be used advantageously in a charged particle instrument by connecting the conductive layer to e.g. ground potential, thereby forming a return path for the impinging charged particles and thus avoiding charging. The invention further relates to a charged particle instrument that is further equipped with an optical microscope.

22 Claims, 1 Drawing Sheet

CHARGED PARTICLE INSTRUMENT EQUIPPED WITH OPTICAL MICROSCOPE

Figure 1:
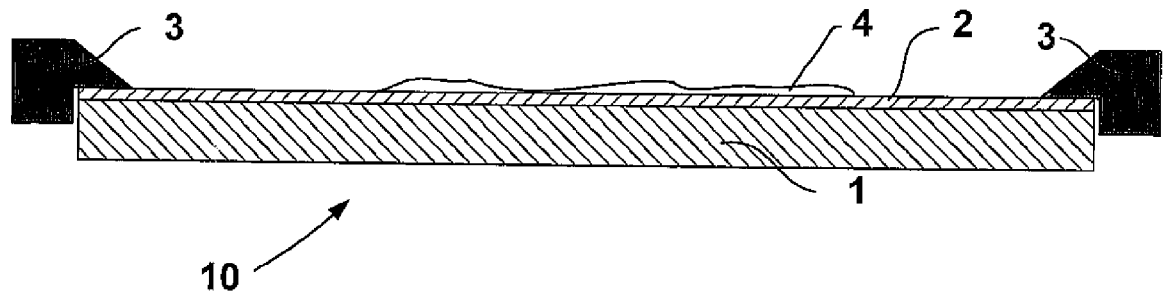

The invention relates to the use of a sample carrier in a charged particle instrument, a method of using such a sample carrier, and an apparatus equipped to use such a sample carrier.

Sample carriers are used to carry samples in a charged particle instrument such as in a Scanning Electron Microscope (SEM) and Focused Ion Beam instruments (FIB).

Charged particle instruments such as a SEM's and a FIB's are known per se.

Charged particle instruments such as a SEM or a FIB employ a focused beam of charged particles, such as electrons or ions, to irradiate a sample with a current of typically between 1 pA and 100 nA. The focused beam (a beam of charged particles with an energy of e.g. between 0.1 keV and 30 keV) is scanned over the sample. In response to the impinging charged particles secondary radiation emanates from the sample in the form of e.g. secondary electrons, X-rays, light, etc. As the beam impinges at one point at a time only, this secondary radiation is (at each moment) position dependant. By detecting the secondary radiation of interest, the sample may be analysed and/or an image may be formed.

To analyse a sample in a charged particle instrument the sample is normally mounted on a stub. The stub may in turn be mounted on e.g. a stage being part of the charged particle instrument. This stage positions the sample such that an area of interest of the sample is scanned by the charged particle beam.

As the sample is irradiated with charged particles, charging of the sample may occur. Charging of the sample influences the position where the beam of charged particles impinges on the sample. Charging also influences e.g. the amount of secondary electrons emanating from the sample. Therefore charging of the sample is a known problem when using a charged particle instrument. The simplest way to avoid charging is by forming the stub from a metal, and in the charged particle instrument connecting the stub (with the sample mounted on it) to a fixed voltage, such as ground potential.

Before the sample is inspected in the charged particle instrument it is often observed in an optical microscope. To that end the sample is mounted on a microscope slide. As known to the person skilled in the art conventional microscope slides are made of glass and are highly insulating. Therefore conventional microscope slides are not suited to be used as a sample carrier in a charged particle instrument.

A disadvantage of the stubs used in charged particle instrument is that they are not compatible with those types of optical microscopy using transmission of light through the sample. Therefore the sample carriers used in a charged particle instrument are not suited as sample carrier in an optical microscope.

The invention aims to provide a sample carrier that can be used in both an optical microscope using transmission of light through the sample and that can be used in charged particle instrument. The invention also aims to provide an alternative to the known sample carriers for charged particle instruments.

To that end the invention comprises the use of an optical microscope slide coated with a transparent conductive layer of a metal oxide as sample carrier in a scanning charged particle apparatus.

The invention is based on the insight that a microscope slide with a conductive coating of metal oxide is very well suited to be used as sample carrier for a charged particle instrument.

Such a microscope slide is known from e.g. SPI Supplies Division, Structure Probe, Inc; West Chester, Pa. 19381-0656 USA, and is sold under the name "SPI Supplies® Brand Indium-Tin-Oxide (ITO) Coated Microscope Slide". These microscope slides are intended to be used in cases where a sample, such as living tissue, is observed at e.g. body temperature. The coating is used as a resistive heater.

The known microscope slide comprises a glass, quartz or polymer carrier, at one side coated with a electrically conductive layer of indium-tin oxide. The conductive layer has a sheet resistance of between 8 Ω and 100 Ω. The conductive layer is not covered with an insulating layer. The microscope slide is transparent to light and can be used as a normal microscope slides. By passing a current through the conductive layer the slides are heated.

It is remarked that similar microscope slides are known from other supplier. However, sheet resistance, exact composition of the conductive layer and method of attaching the conductive layer to the carrier may differ. As the current of the charged particle beam is less than 100 nA or even less than 1 nA, a sheet resistance of less than 1 kΩ or even less than 1 MΩ results in sufficient low resistance so as to cause negligible charging.

By using the microscope slide in a charged particle instrument and connecting the conductive layer to a fixed potential—such as ground potential-charging of the glass or polymer of the microscope slide is avoided. As the conductive layer itself is not covered with an insulating layer, a sample mounted on the layer is connected to the conductive layer and thereby charging of the sample is avoided.

Such layers can be made very smooth, making them well suited for inspection not only in an optical microscope but also in a charged particle instrument. A measurement of the surface roughness of an ITO (Indium Tin Oxide) layer with a thickness of 365 nm, corresponding with a sheet resistance of 10 Ω, is given in 'Super smooth metal oxide thin films using closed field reactive magnetron sputtering', J. M. Walls et al., 48$^{th}$ Annual Technical Conference Proceedings of the Society of Vacuum Coaters (2005), 36-40. These measurements show that the roughness of the layer shows a peak-to-peak roughness of 4.4 nm and an RMS roughness of 0.453 nm, comparable to the roughness of the underlying glass surface.

Figure 2:
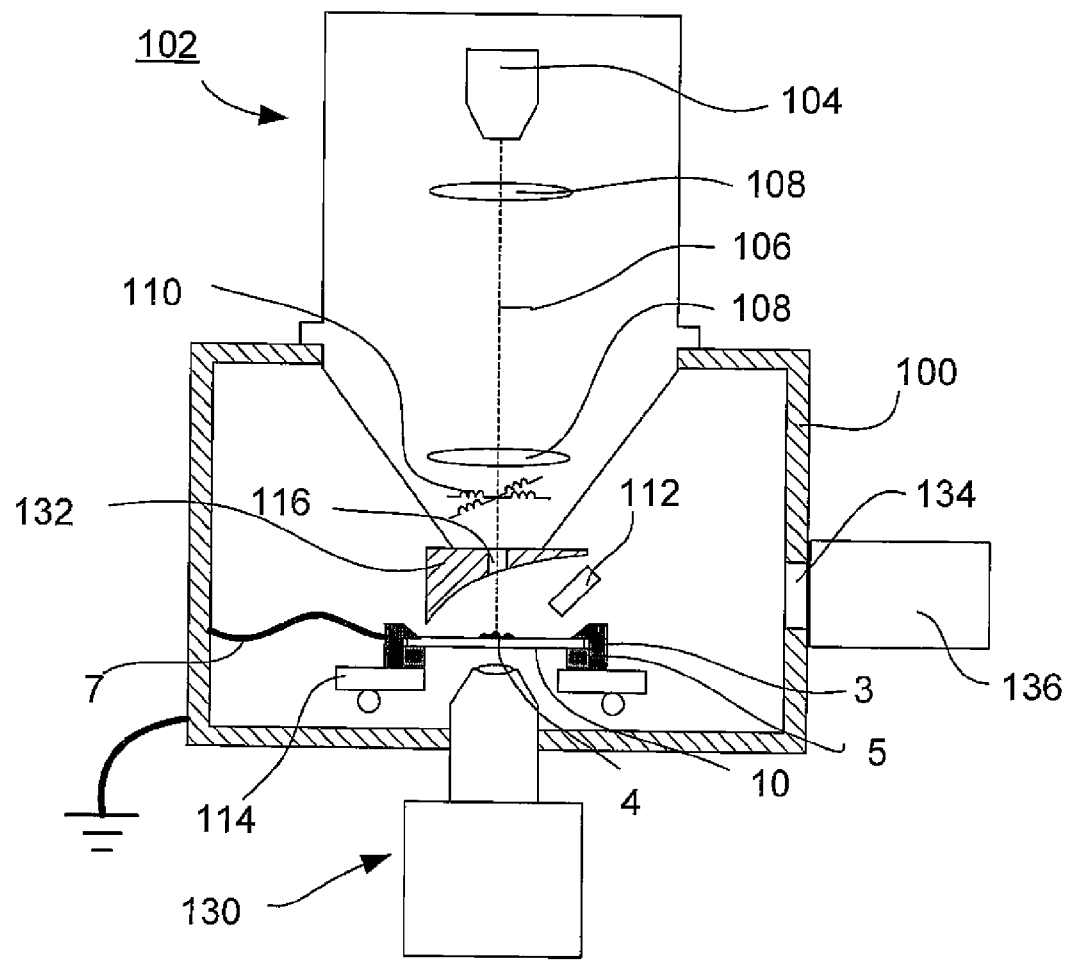

It is remarked that in US patent application number US2006/0284108A1 a microscope slide is described as sample carrier in a charged particle apparatus. FIG. 2 of the mentioned patent application shows a particle optical apparatus where a microscope slide is used as sample carrier, on which microscope slide a vacuum seal is formed. The problem of charging is mentioned in the corresponding part of the description, and a solution is proposed by the use of an ESEM column, that is: to work in a vacuum with a partial pressure of about 0.1 mbar to 10 mbar of e.g. water, resulting in a reduction of charging. As another possibility mentioned is to evaporate a metal onto a microscope slide. As known to the person skilled in the art this will normally result in a microscope slide with a much reduced transparency and a surface roughness inferior to the surface roughness reported in the before mentioned article of Walls et al. The patent application does not mention the use of a metal oxide as a coating for microscope slides.

It is also remarked that U.S. Pat. No. 4,183,614 describes a microscope slide with a slightly conductive coating. It describes in its column 3, lines 47 to 50 that such a coating is beneficial for dissipating charge. As known to users of optical microscopes small insulating particles, such as dust particles, may get charged while bringing them onto a microscope slide. As a result the particles may group together or form clusters, which may give rise to artifacts. The microscope slides with a conductive coating may be used to eliminate this effect. However, dissipating initial charge from e.g. a charged dust particle differs from the removal of an impinging current in a vacuum. U.S. Pat. No. 4,183,614 does not mention or imply the use of such a microscope slide in a particle-optical apparatus, such as a SEM.

In a further embodiment the metal oxide is ITO (Indium Tin Oxide).

ITO is a well known transparent coating for e.g. glasses and is used in the microscope slides sold by SPI. Other uses are in e.g. the conductive patterns on glass in LCD displays, plasma displays, etc.

In another embodiment of the use of an optical microscope slide coated with a transparent conductive layer as sample carrier in a charged particle apparatus the charged particle instrument is a SEM or a FIB.

In an aspect the invention provides a method for observing a sample, the method comprising providing an optical microscope slide, at least one side of said microscope slide covered with a transparent conductive layer, providing a sample, and mounting the sample on the optical microscope slide at the side of the slide covered with the transparent conductive layer, characterized in that the method further comprises inspecting or modifying the sample in an evacuated volume of a charged particle apparatus while the sample is mounted on the microscope slide, said conductive layer electrically connected to a fixed potential.

In an embodiment of the method according to the invention the fixed potential is earth potential.

By grounding the microscope slide the impinging current is returned to earth.

In another embodiment to the method according to the invention the method further comprises observing the sample with an optical microscope.

In a further embodiment of the method according to the invention the metal oxide comprises indium-tin oxide (ITO).

In another embodiment of the method according to the invention the charged particle apparatus is a SEM or a FIB.

In another aspect the invention provides an apparatus for inspecting a sample, said apparatus equipped with an optical microscope to observe the sample, and a charged particle column to observe or modify the sample with a beam of charged particles, is according to the invention characterized in that the optical microscope is equipped to inspect the sample while it is mounted on a microscope slide, said microscope slide coated with a conductive layer, the charged particle column is equipped to inspect or modify the sample while it is mounted on the microscope slide, and the conductive layer of the microscope slide is kept at a constant voltage while observing or modifying the sample with the beam of charged particles.

It is remarked that an apparatus equipped with an optical microscope and a charged particle column is known and was commercially sold by Akashi Seisakusho Ltd, Japan, under the name LEM-2000. The apparatus is equipped with an optical microscope with a magnification of between 50× and 250×, and a TEM column for observing the sample with a magnification of between 250× and 45000×. This apparatus is equipped to observe samples mounted on grids with a diameter of 7 mm. It is impossible to observe samples mounted on a microscope slide with this apparatus.

It is also remarked that an apparatus equipped with an optical microscope and a charged particle column is sold by Topcon, Japan as the Opti-SEM 300. This apparatus is equipped with an optical microscope and a SEM column. However, the optical microscope is not capable to observe light transmitted through the sample. The apparatus is not equipped to handle microscope slides, nor is it equipped to keep the conductive layer of such a slide at constant potential.

In an embodiment of the apparatus according to the invention the apparatus is equipped to inspect the sample by using light transmitted through the sample.

In another embodiment of the apparatus according to the invention the apparatus is equipped to irradiate the sample with the beam of charged particles while it is simultaneously inspected with the optical microscope.

In yet another embodiment of the apparatus according to the invention the charged particle column is a FIB column or a SEM column.

In still another apparatus according to the invention the region of interest that is observed with the optical microscope is centred with the region of interest that is observed with the charged particle column.

In this embodiment it is possible to observe a region of interest simultaneously with the charged particle column and the optical microscope. It is remarked that it is possible that both the optical microscope and the charged particle column observe the sample from the same side, but that it is also possible that they observe the sample from opposite sides, i.e. that the optical microscope views the sample through the microscope slide.

In yet another embodiment of the apparatus according to the invention the apparatus is equipped to form a vacuum seal against the microscope slide when the sample is observed with a beam of charged particles.

As known to the person skilled in the art a sample to be inspected and/or analysed in a charged particle instrument must be placed in an evacuated environment. The microscope slide shows a perfectly flat surface, on which a vacuum seal can be formed with e.g. an O-ring. This makes the microscope slide especially suited for use in a SEM of the type described in the before mentioned US patent application number US2006/0284108A1.

The invention will be described on the basis of figures, whereby identical numerals indicate corresponding features.

To this end:

FIG. 1 schematically shows a microscope slide according to the invention, and

FIG. 2 schematically shows a particle-optical apparatus equipped to use the microscope slide according to the invention.

FIG. 1 schematically shows a microscope slide according to the invention.

The microscope slide 10 comprises a glass plate 1 covered with a thin, conductive layer 2 of a metal oxide, A sample 4 is placed on the side of the microscope slide on which the conductive layer 2 is deposited. Herewith the sample 4 is in electrical contact with the conductive layer 2. By connecting the conductive layer 2 to a fixed potential, such as ground potential, charging of the sample is avoided. This can be done by contacting the conductive layer with a metal holder, of which a part 3 is shown.

FIG. 2 schematically shows a particle-optical apparatus equipped to use the microscope slide according to the invention.

A vacuum chamber 100 is evacuated by vacuum pumps (not shown). On the vacuum chamber a charged particle column 102 is mounted. The charged particle column comprises a charged particle source 104 producing a beam of charged particles, such as electrons or ions, along a particle-optical axis 106. The charged particles are manipulated by lenses 108 and deflector 110, thereby enabling focusing of the charged particle beam onto the sample 4 and scanning it over the sample. Where the charged particle beam irradiates the sample secondary radiation in the form of e.g. secondary electrons, backscattered electrons or X-rays are generated. This secondary radiation is detected by a detector 112.

The sample 4 is mounted on a microscope slide 10 according to the invention. The microscope slide is pushed against a metal holder 3 by resilient member 5, thereby ensuring an electric contact between the metal holder 3 and the microscope slide 10. A flexible wire 7 connects the metal holder 3 with a fixed potential, that is: it is grounded via the vacuum chamber. The metal holder 3 and the microscope slide 10 are mounted on a stage 114, so that an area of interest on the sample 4 can be brought on the particle-optical axis 106.

An optical microscope 130 is mounted on the vacuum chamber 100 in such a way that the optical axis of the optical microscope and the particle-optical axis 106 of the charged particle column 102 coincide. Therefore the region of interest observed by the optical microscope 130 is aligned with the region of interest observed by the charged particle column 102.

Light from a light source 136, such as a laser, a LED light or an incandescent light bulb, is passed through the wall of the vacuum chamber 100 through window 134 and focused on the sample 4 by mirror 132. Mirror 132 shows a hole 116 to pass the beam of charged particles produced by the charged particle column 102 to the sample.

The person skilled in the art will recognize that many variations are possible. The light source 136 can e.g. be mounted inside the vacuum chamber 100, so that window 134 is not necessary anymore. A mirror focusing the light onto the sample need not be used. Also the microscope 130 can be positioned inside the vacuum chamber 100. The path of light can be reversed, that is: the light may irradiate the sample through the microscope slide 10 and the optical microscope 130 can view the sample from the same side as where the particle beam irradiates the sample.

The invention claimed is:

1. Apparatus for inspecting a sample, said apparatus equipped with an optical microscope to observe the sample, and a charged particle column for producing a focused beam of charged particles to observe or modify the sample with said beam of charged particles,
characterized in that
    the optical microscope is equipped to inspect the sample while it is mounted on a microscope slide, said microscope slide coated with a conductive layer,
    the charged particle column is equipped to inspect or modify the sample while it is mounted on the microscope slide, and
    the conductive layer of the microscope slide is kept at a constant voltage while observing or modifying the sample with the beam of charged particles.

2. The apparatus according to claim 1 in which the constant voltage equals ground potential.

3. The apparatus according to claim 2 in which the optical microscope is equipped to inspect the sample by using light transmitted through the sample.

4. The apparatus according to claim 2 in which the apparatus is equipped to irradiate the sample with the beam of charged particles while it is simultaneously inspected with the optical microscope.

5. The apparatus according to claim 2 in which the charged particle column is a FIB column or a SEM column.

6. The apparatus according to claim 2 in which the region of interest that is observed with the optical microscope is centred with the region of interest that is observed with the charged particle column.

7. The apparatus according to claim 2 in which the apparatus is equipped to form a vacuum seal against the microscope slide when the sample is observed with a beam of charged particles.

8. Apparatus according to claim 1 in which the optical microscope is equipped to inspect the sample by using light transmitted through the sample.

9. The apparatus according to claim 8 in which the apparatus is equipped to irradiate the sample with the beam of charged particles while it is simultaneously inspected with the optical microscope.

10. The apparatus according to claim 8 in which the charged particle column is a FIB column or a SEM column.

11. The apparatus according to claim 8 in which the region of interest that is observed with optical microscope is centred with the region of interest that is observed with the charged particle column.

12. The apparatus according to claim 8 in which the apparatus is equipped to form a vacuum seal against the microscope slide when the sample is observed with a beam of charged particles.

13. Apparatus according to claim 1 in which the apparatus is equipped to irradiate the sample with the beam of charged particles while it is simultaneously inspected with the optical microscope.

14. The apparatus according to claim 13 in which the charged particle column is a FIB column or a SEM column.

15. The apparatus according to claim 13 in which the region of interest that is observed with the optical microscope is centred with the region of interest that is observed with the charged particle column.

16. The apparatus according to claim 13 in which the apparatus is equipped to form a vacuum seal against the microscope slide when the sample is observed with a beam of charged particles.

17. Apparatus according claim 1 in which the charged particle column is a FIB column or a SEM column.

18. The apparatus according to claim 17 in which the region of interest that is observed with the optical microscope is centred with the region of interest that is observed with the charged particle column.

19. The apparatus according to claim 17 in which the apparatus is equipped to form a vacuum seal against the microscope slide when the sample is observed with a beam of charged particles.

20. Apparatus according to claim 1 in which the region of interest that is observed with the optical microscope is centred with the region of interest that is observed with the charged particle column.

21. The apparatus according to claim 20 in which the apparatus is equipped to form a vacuum seal against the microscope slide when the sample is observed with a beam of charged particles.

22. Apparatus according to claim 1 in which the apparatus is equipped to form a vacuum seal against the microscope slide when the sample is observed with a beam of charged particles.

* * * * *

UNITED STATES PATENT AND TRADEMARK OFFICE
CERTIFICATE OF CORRECTION

PATENT NO. : 7,675,034 B2
APPLICATION NO. : 12/130038
DATED : March 9, 2010
INVENTOR(S) : Jacob Simon Faber It is certified that error appears in the above-identified patent and that said Letters Patent is hereby corrected as shown below:

In the Specifications

Column 2, Line 37 – Please change "spuftering" to read "sputtering";

Signed and Sealed this
Fourteenth Day of May, 2013

Teresa Stanek Rea
*Acting Director of the United States Patent and Trademark Office*